United States Patent [19]
Han

[11] Patent Number: 6,041,338
[45] Date of Patent: Mar. 21, 2000

[54] INTERPOLATION FILTER SYSTEM

[75] Inventor: Dong-Hwan Han, Kyungki-do, Rep. of Korea

[73] Assignee: LG Semicon, Co., Ltd., Cheongju, Rep. of Korea

[21] Appl. No.: 09/035,016

[22] Filed: Mar. 5, 1998

[30] Foreign Application Priority Data

May 6, 1997 [KR] Rep. of Korea ................. 97-17319

[51] Int. Cl.[7] .................. G06F 17/10; G06F 17/17
[52] U.S. Cl. ............................ 708/313; 708/316
[58] Field of Search .................... 708/300, 303, 708/308, 313, 316, 317

[56] References Cited

U.S. PATENT DOCUMENTS

| | | | |
|---|---|---|---|
| 4,192,008 | 3/1980 | Mandeville | 708/317 |
| 4,510,598 | 4/1985 | Gockler et al. | 370/307 |
| 4,825,396 | 4/1989 | Gazsi | 708/318 |

OTHER PUBLICATIONS

"Interpolation and Decimation of Digital Signals—A Tutorial Review", Ronald E. Crochier et al., Proceeding of the IEEE, vol. 69, No. 3, Mar. 1981, pp. 417–448.

*Primary Examiner*—Ohuong Dinh Ngo
*Attorney, Agent, or Firm*—Fleshner & Kim

[57] ABSTRACT

A data interpolating filter is disclosed, in which a wave digital filter is used for processing two-channel data with one data path. A sample and hold part samples and holds data, and selectively provides the sampled and held data for at least two different channels. An adapter filters the sampled and held data from the sample and hold part to produce interpolated data. The adapter filters the sampled and held data using a selectable one of at least two different filter coefficients, and a filtering signal delaying part delays the interpolated data in response to selecting signals.

15 Claims, 3 Drawing Sheets

INTERPOLATION FILTER SYSTEM

BACKGROUND OF THE INVENTION

1. Field of the Invention

The present invention relates to a digital filter, and more particularly, to an interpolating filter system.

2. Background of the Related Art

FIGS. 1A and 1B are block diagrams of related art data interpolating filters. A zero padding block 1 up-samples twice the received data for padding zero between the data. First and second adapters 3 and 4 filter the data over-sampled in the zero padding block 1. A first delaying block 2 delays the data over-sampled in the zero padding block 1 by one sample unit and provides the delayed data to the first adapter 3. Second and third delaying blocks 5 and 6 delay the data fed back from the first and second adapters 3 and 4 by two sample units, and provide the delayed fed back data to the first and second adapters 3 and 4, respectively. An adder 7 adds the data filtered by the first and second adapters 3 and 4. Each of the first and second adapters 3 and 4 is provided with two input terminals and two output terminals, has a filter coefficient that provides a proper filter characteristic, and includes an adder and a multiplier.

In the aforementioned data interpolating filter, the received data is up-sampled in the zero padding block 1 and provided to the first adapter 3 and the second adapter 4. The data provided to the first adapter 3 is delayed by one sample unit by the delaying block 2. The delayed data provided to the first adapter 3 and the data provided to the second adapter 4 are filtered by the first and second adapters. The filtered data from the first and second adapters 3 and 4 are added by adder 7. In addition, filtered data from each of the first and second adapters 3 and 4 is provided to the second and third delayed parts 5 and 6, respectively.

The related art data interpolating filter shown in FIG. 1B is a modified version of the related art data interpolating filter shown in FIG. 1A. Each of the first and second adapters 8 and 9 has a proper filter coefficient for filtering received data, and first and second delaying blocks 10 and 11 delay the data from the first and second adapters 8 and 9 by one sample unit, and feed back the delayed data to the first and second adapters 8 and 9. A first zero padding block 12 twice up-samples the data filtered in the first adapter 8 and pads zero between the data. A second zero padding block 13 twice up-samples the data filtered in the second adapter 9 and pads zero between the data. A third delaying block 14 delays the data up-sampled in the first zero padding block 12 by one sample unit, and an adder 15 adds the data delayed in the third delaying block 14 and the data from the second padding block 13.

The related art data interpolating filter shown in FIG. 1A positions the first and second zero padding blocks 12 and 13, and the third delaying block 14 downstream of the first and second adapters 8 and 9 for reducing the size of the first and second delaying blocks 10 and 11 that feed back the data from the first and second adapters 8 and 9. Though the data interpolating filters shown in FIGS. 1A and 1B basically have the same function, the data interpolating filter shown in FIG. 1B is preferred because it uses less flipflops.

However, the above-described related art data interpolating filters are complicated in terms of hardware because of the first and second adapters provided on upper and lower sides of the filter. In addition, the above-described related art data interpolating filters are not efficient in terms of data flow because hardware for a mono channel is used even if stereo data is being processed.

The above references are incorporated by reference herein where appropriate for appropriate teachings of additional or alternative details, features and/or technical background.

SUMMARY OF THE INVENTION

Accordingly, the present invention is directed to a data interpolating filter utilizing a wave digital filter that substantially obviates the problems associated with the related art.

The present invention may be achieved in whole or in part by a data interpolating filter, comprising: (1) a sample and hold part that samples and holds data, and that selectively provides the sampled and held data for at least two different channels; and (2) a wave digital filter that filters the sampled and held data from the sample and hold part to produce interpolated data.

The present invention may also be achieved in whole or in part by a data interpolating system, comprising a plurality of data interpolating filter stages connected in series, wherein each data interpolating filter stage comprises: (1) at least one sample and hold part that samples and holds data, and that selectively provides the sampled and held data for at least two different channels; and (2) a wave digital filter that filters the sampled and held data from at least one of the at least two sample and hold parts to produce interpolated data.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

The data interpolating filter of the present invention simplifies hardware requirements by using one path for processing two-channel data. That is, one adapter having an upper unit and a lower unit is used for selectively designating a filter coefficient in order to make two-channel processing with one data path possible.

Figure 1A:
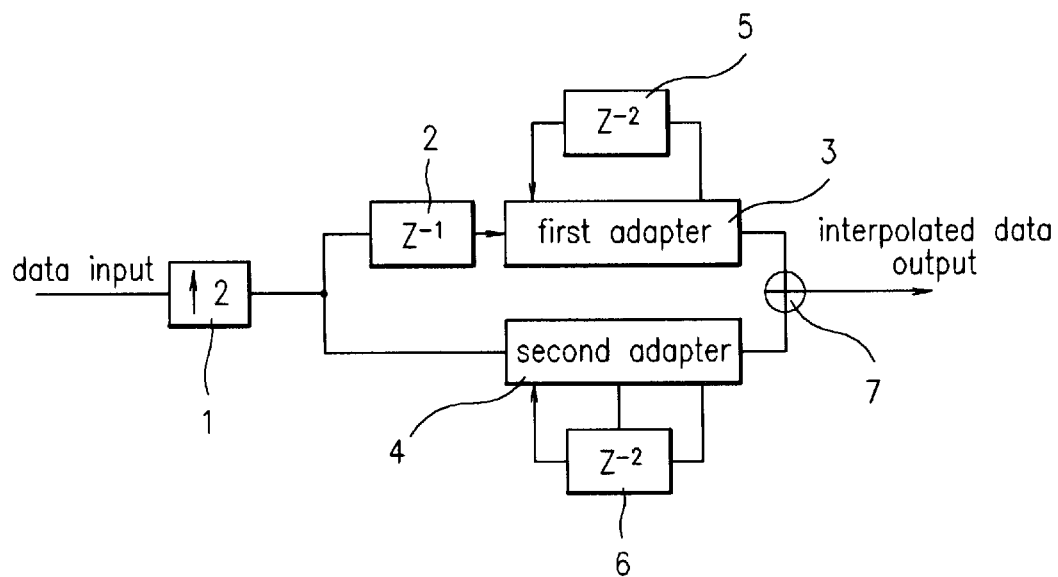
FIGS. 1A and 1B are block diagrams of related art data interpolating filters.
Figure 1B:
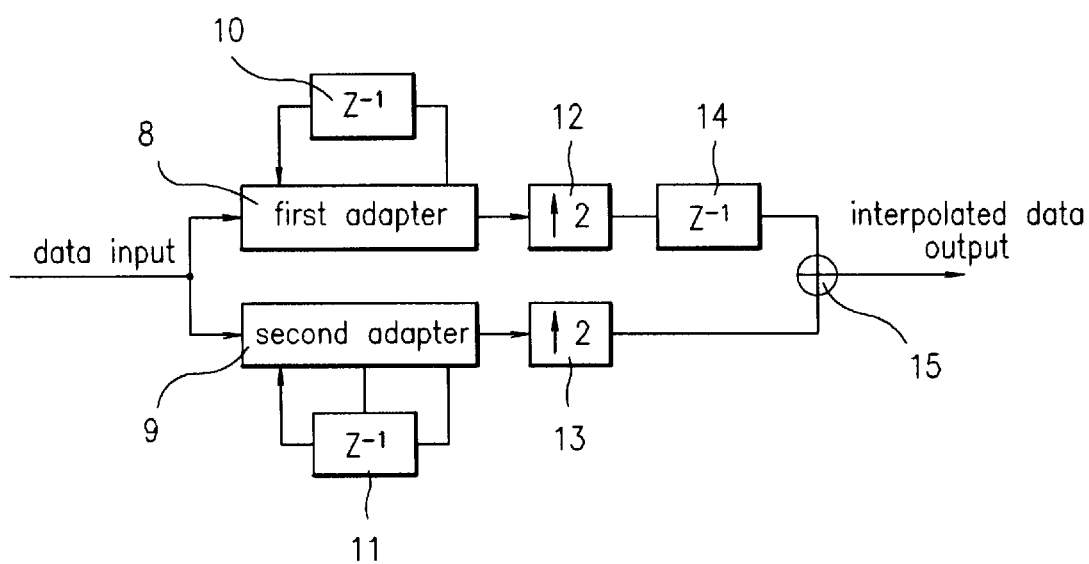
Figure 2:
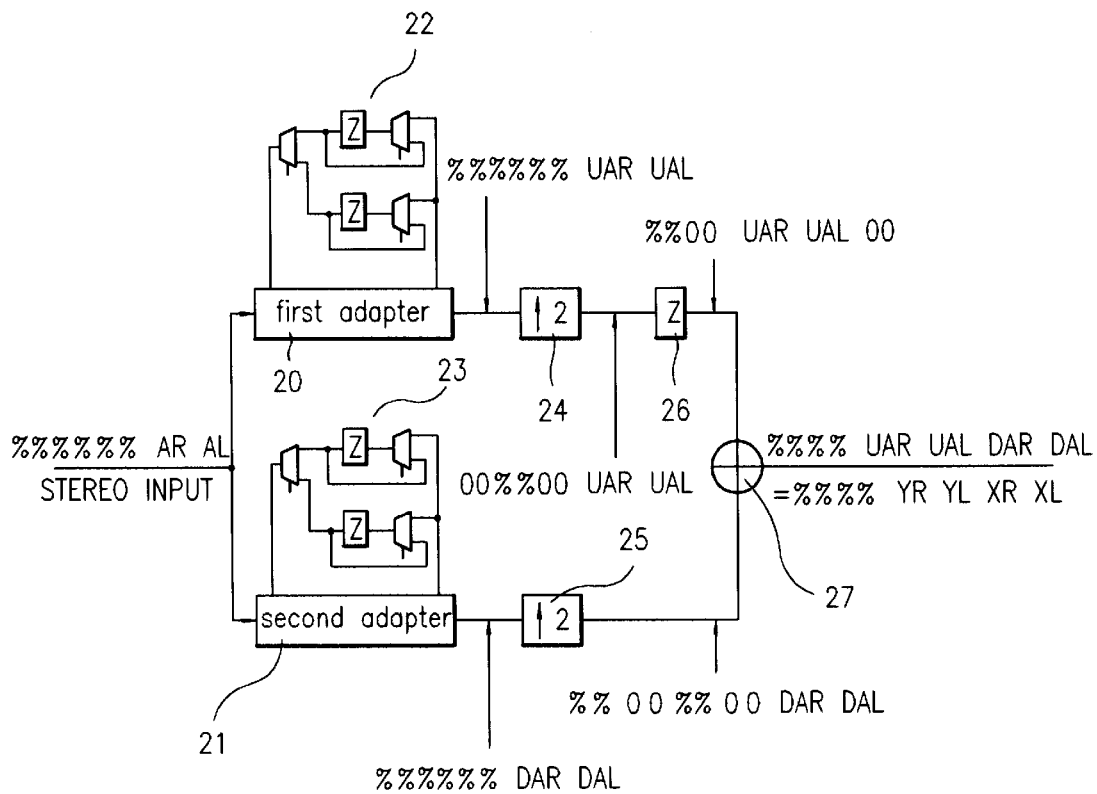
FIG. 2 is a block diagram illustrating a theory of operation of the data interpolating filter of the present invention.

The novel operation of the data interpolating filters of the present invention can be explained with reference to FIG. 2. Referring to FIG. 2, each of the first and second adapters 20 and 21 has a specific filter coefficient for filtering stereo-data having left and right portions. A first filtering signal delaying part 22 for delays the data filtered in the first adapter 20, and feeds the filtered data back to the first adapter 20. A second filtering signal delaying part 23 delays the data filtered in the second adapter 21, and feeds the filtered data back to the second adapter 21. A first zero padding part 24 twice up-samples the data interpolated in the first adapter 20, and a second zero padding part 25 twice up-samples the data interpolated in the second adapter 21. A delaying part 26 delays the data up-sampled in the first zero padding part 24 by one sample unit, and an adder 27 adds the data from the delaying part 26 and the data from the second zero padding part 25.

The data subjected to a filtering operation in the first adapter 20 of the data interpolating filter of FIG. 2 passes through the first padding part 24, the delaying part 26 and the adder 27 in succession. This causes one of the two sets of data to always have a value of zero at the adder 27. Accordingly, the operation of adding resultant data from the upper and lower units can be accomplished by selecting the non-zero data.

Figure 3:
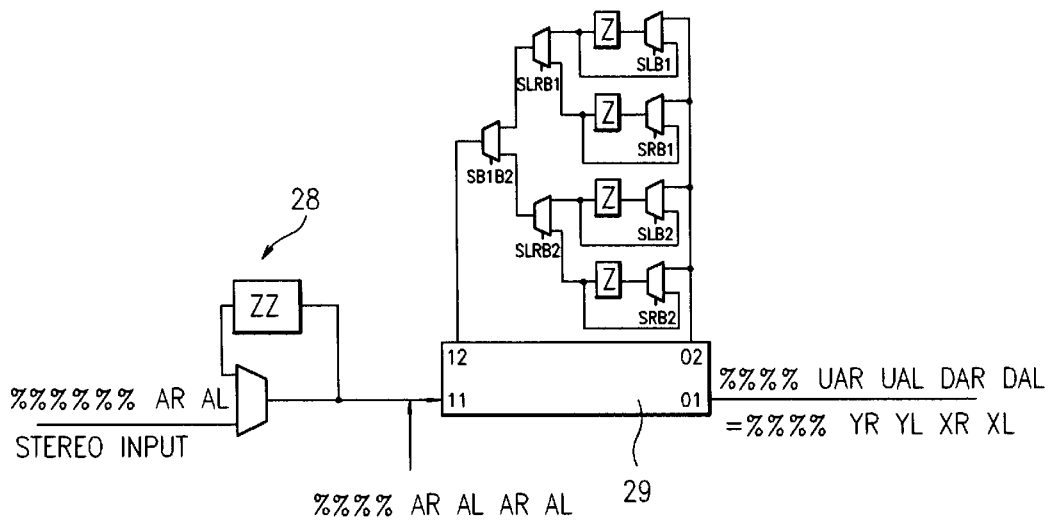
FIG. 3 is a block diagram of a preferred embodiment of a single-stage interpolating filter in accordance with the present invention.

The data interpolating filter of the present invention, shown in FIG. 3 employs such an operation. In the data interpolating filter shown in FIG. 3, a sample and hold part 28 is adapted to provide data separately to an upper unit and a lower unit of the adapter 29. Thus, a data interpolating filter can be provided which utilizes one data path for two-channel data processing, and that performs data interpolation in the same manner as the data interpolating filter shown in FIG. 2. That is, the data interpolating filter shown in FIG. 3 provides the same interpolated data (e.g., "% % % % UAR UAL DAR DAL") provided by the data interpolating filter shown in FIG. 2 in response to the same input data (e.g., "% % % % % % AR AL"). Thus, a data interpolating filter is provided that is capable of up-sampling by more than two times within a limit placed by a system clock.

Figure 4:
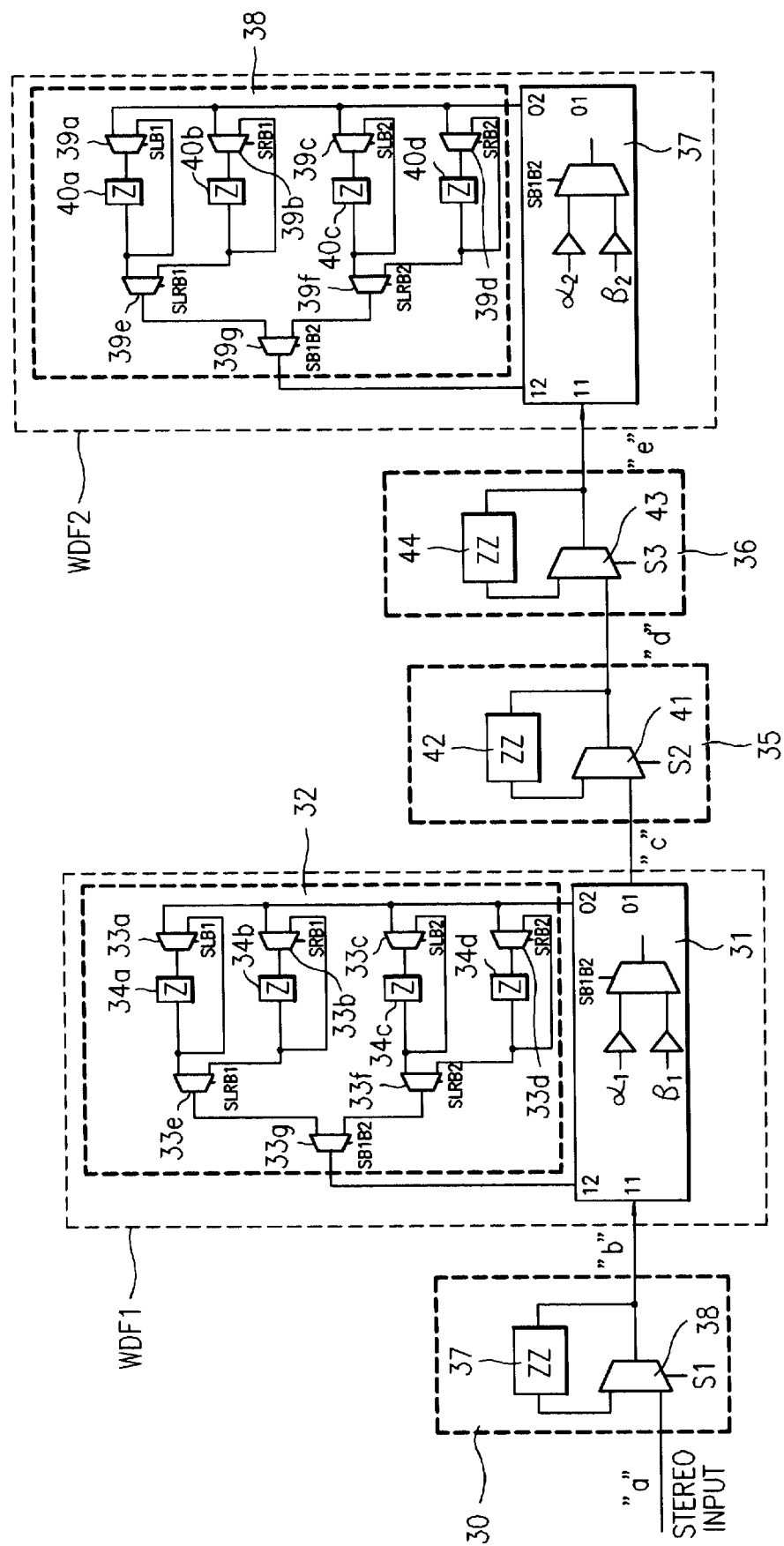
FIG. 4 is a block diagram of a multi-stage interpolating system employing the single-stage interpolating filter of this invention.

A preferred embodiment of a data interpolating system employing the data interpolating filter of this invention is shown in FIG. 4. A sample and hold part 30 has a multiplexer 38 for multiplexing stereo data with left and right portions, received in response to a control signal S1. A delaying part 37 delays feedback data by two sample units by separately sampling and holding the received stereo data for each channel. A first wave digital filter WDF1 comprises an adapter 31 and a filtering signal delaying part 32. The adapter 31 is adapted to have first and second filter coefficients $\alpha 1$ and $\beta 1$ in response to a provided filter coefficient specifying signal SB1B2. The adapter 31 filters the data from the sample and hold part 30 to produce interpolated data.

The filtering signal delaying part 32 delays the interpolated data in response to selecting signals SLB1, SRB1, SLB2, SRB2, SLRB1, SLRB2. The filtering signal delaying part 32 has multiplexers 32a–32g for receiving the selecting signals, and delaying parts 34a–34d for delaying signals from the multiplexers 33a–33d, respectively. Multiplexer 33g is disposed at an output terminal of the filtering signal delaying part 32, and is adapted to receive a control signal identical to the filter coefficient specifying signal SB1B2 supplied to the adapter 31.

The sample and hold part 30 and the first wave digital filter WDF1 make up a data interpolating filter with two-times up-sampling. However, the system can be expanded into a multistage data interpolating filter system for greater than two-times up-sampling. Such a multistage data interpolating filter system comprises a second sample and hold part 35 having a multiplexer 41 for multiplexing the data received from the adapter 31, in response to a control signal S2, and a delaying part 42 which delays feedback data by two sample units by separately sampling and holding the received data for each channel. A third sample and hold part 36 comprises a multiplexer 43 for multiplexing the data received from the second sample and hold part 33, in response to a control signal S3, and a delaying part 44 which delays feedback data by two sample units by separately sampling and holding the received data for each channel.

A second wave digital filter WDF2 comprises an adapter 37 and a filtering signal delaying part 32. The adapter 37 is adapted to have first and second filter coefficients $\alpha 2$ and $\beta 2$ in response to a provided filter coefficient specifying signal SB1B2. The adapter 37 filters the data from the sample and hold part 36 to produce interpolated data. The filtering signal delaying part 38 delays the interpolated data in response to selecting signals SLB1, SRB1, SLB2, SRB2, SLRB1, SLRB2. The filtering delaying part 38 has multiplexers 39a–39g for receiving the selecting signals, and delaying parts 40a–40d for delaying signals from the multiplexers 39a–39d, respectively. Multiplexer 39g is disposed at an output terminal of the filtering signal delaying part 38, and is adapted to receive a control signal identical to the filter coefficient specifying signal SB1B2 supplied to the adapter 37.

The operation of the above-described data interpolating filter system will now be explained. When stereo data "a", having left and right portions, is received at the input terminal of the multiplexer 38 in the sample and hold part 30, data from the multiplexer 38 is fed back to the multiplexer 38 via the delaying part 37 in response to a control signal S1. The sampled and held data "b" is provided to the adapter 31 of the first wave digital filter WDF1.

Prior data stored in the filtering signal delaying part 32 of the WDF1 is put into operation with filter coefficients $\alpha 1$ and $\beta 1$ to produce data "c". Data "c" is then stored in the filtering signal delaying part 32. The multiplexer in the adapter 31 selects a filter coefficient in response to the filter coefficient selecting signal SB1B2. The filter coefficient selecting signal SB1B2 is identical to the filter coefficient selecting signal provided to the final multiplexer 33g in the filtering signal delaying part 32. Data "c" from the WDF1 is provided to the sample and hold part 35 with the multiplexer 41 and the delaying part 39.

The sample and hold part 35 produces data "d", which is provided to the sample and hold part 36 with the multiplexer 43 and the delaying part 44. The sample and hold parts 35 and 36 sample and hold received data, and feed received data back to multiplexers 41 and 43, respectively, in response to control signals S2 and S3, respectively. The sample and hold part 36 produces data "e", which is received by the adapter 37 of the second wave digital filter WDF2. The data "e" is put into operation with new filter coefficient selecting signals $\alpha 2$ and $\beta 2$ to produce final data "f".

As has been explained, the data interpolating filter system of the present invention simplifies the required hardware by using half the number of adapters used in related art systems. In addition, the data interpolating filter system of this invention is more efficient than related art systems in terms of data flow because it processes two-channel data using single data path.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A data interpolating filter, comprising:
   a sample and hold part that samples and holds data, and that selectively provides the sampled and held data for at least two different channels; and
   a wave digital filter that filters the sampled and held data from the sample and hold part to produce interpolated data.

2. The data interpolating filter of claim 1, wherein the sample and hold part samples and holds the data in response to a control signal.

3. The data interpolating filter of claim 1, wherein the wave digital filter comprises:
   an adapter that filters the sampled and held data from the sample and hold part to produce interpolated data, wherein the adapter filters the sampled and held data using a selectable one of at least two different filter coefficients; and
   a filtering signal delaying part that delays the interpolated data in response to selecting signals.

4. The data interpolating filter of claim 3, wherein the one of the at least two different filter coefficients is selected with a filter coefficient specifying signal.

5. The data interpolating filter of claim 3, wherein the filtering signal delaying part comprises:
   at least two multiplexers that receive the selecting signals, wherein one of the at least two multiplexers is disposed at an output terminal of the wave digital filter; and at least one delaying part that delays feed back signals generated by at least one of the at least two multiplexers.

6. The data interpolating filter of claim 1, wherein the sample and hold part comprises:
   a multiplexer that multiplexes the data and outputs the multiplexed data; and
   a delaying part that receives the multiplexed data output by the multiplexer, delays the multiplexed data, and provides the delayed multiplexed data to the multiplexer as a feedback signal.

7. The data interpolating filter of claim 6, wherein the delaying part delays the multiplexed data by two sample units.

8. A data interpolating system, comprising:
   a plurality of data interpolating filter stages connected in series, wherein each data interpolating filter stage comprises:
   at least one sample and hold part that samples and holds data, and that selectively provides the sampled and held data for at least two different channels, and
   a wave digital filter that filters the sampled and held data from at least one of the at least two sample and hold parts to produce interpolated data.

9. The data interpolating system of claim 8, wherein a kh data interpolating filter stage comprises k sample and hold parts connected in series that receive data from a $(k-1)_{th}$ stage adapter.

10. The data interpolating system of claim 9, wherein each of the sample and hold parts comprise:
    a multiplexer that multiplexes data received from either the $(k-1)_{th}$ data interpolating filter stage or from another sample and hold part and outputs the multiplexed data; and
    a delaying part that receives the multiplexed data output by the multiplexer, delays the multiplexed data, and provides the delayed multiplexed data to the multiplexer as a feedback signal.

11. The data interpolating system of claim 10, wherein the delaying part delays the multiplexed data by two sample units.

12. The data interpolating system of claim 10, wherein the multiplexer in each of the sample and hold parts receives a control signal.

13. The data interpolating system of claim 8, wherein the wave digital filter comprises:
    an adapter that filters the sampled and held data from the at least one sample and hold part to produce interpolated data, wherein the adapter filters the sampled and held data using a selectable one of at least two different filter coefficients; and
    a filtering signal delaying part that delays the interpolated data in response to selecting signals.

14. The data interpolating system of claim 13, wherein the one of the at least two different filter coefficients is selected with a filter coefficient specifying signal.

15. The data interpolating system of claim 13, wherein the filtering signal delaying part comprises:
    at least two multiplexers that receiving the selecting signals, wherein one of the at least two multiplexers is disposed at an output terminal of the wave digital filter; and
    at least one delaying part that delays feed back signals generated by at least one of the at least two multiplexers.

* * * * *